United States Patent [19]

Mangan et al.

[11] Patent Number: 5,471,478
[45] Date of Patent: Nov. 28, 1995

[54] FLASH EEPROM ARRAY DATA AND HEADER FILE STRUCTURE

[75] Inventors: John S. Mangan, Santa Cruz; Robert D. Norman, San Jose; Jeffrey Craig, Freemont; Richard Albert, Santa Clara; Anil Gupta, Irvine; Jeffrey D. Stai, Placentia; Karl M. J. Lofgren, Newport Beach, all of Calif.

[73] Assignees: SunDisk Corporation, Santa Clara; Western Digital Corporation, Irvine, both of Calif.

[21] Appl. No.: 401,942

[22] Filed: Mar. 10, 1995

Related U.S. Application Data

[63] Continuation of Ser. No. 252,052, Jun. 1, 1994, Pat. No. 5,438,573, which is a continuation of Ser. No. 759,497, Sep. 13, 1991, abandoned.

[51] Int. Cl.$^6$ .................................................... G06F 11/00
[52] U.S. Cl. .................... 371/10.3; 371/10.2; 365/200
[58] Field of Search ................................ 371/10.1, 10.2, 371/10.3; 365/200

[56] References Cited

U.S. PATENT DOCUMENTS

| | | |
|---|---|---|
| 4,970,692 | 11/1990 | Ali et al. . |
| 5,200,959 | 4/1993 | Gross et al. . |
| 5,268,870 | 12/1993 | Harari . |
| 5,270,979 | 12/1993 | Harari et al. . |
| 5,297,148 | 3/1994 | Harari et al. . |

FOREIGN PATENT DOCUMENTS 392895 of 1990 European Pat. Off. .

OTHER PUBLICATIONS

Lai, "Writing MSDOS® Device Drivers," *The Waite Group*, Second Edition, pp. 475–479.

Lai, "Writing MSDOS® Device Drivers," *The Waite Group*, Second Edition, pp. 275–280.

Bartee, "Digital Computer Fundamentals," *McGraw-Hill, Inc.*, Sixth Edition, pp. 263–265.

Short, "Microprocessors & Programmed Logic," *Prentice-Hall, Inc.*, (1987) pp. 492–495 and 514–518.

*Primary Examiner*—Vincent P. Canney
*Attorney, Agent, or Firm*—Majestic, Parsons, Siebert & Hsue

[57] ABSTRACT

A file structure employed in a flash electrically erasable and programmable read only memory ("EEPROM") system and aspects of forming and using certain data fields within such a file structure. An array of rows and columns of EEPROM memory cells is divided into blocks of cells that are separately addressable for the purpose of erasing an entire block of cells at the same time. Each block contains several rows of cells with certain columns thereof storing a sector of data, typically 512 bytes of data, and other columns of cells within the same rows being used as spare cells to replace any defective sector data cells and store overhead (header) information about the block and the data sector. Such overhead information includes pointers to locations of any defective sector data cells within the block, whether the block has been mapped out in favor of another block, error correction codes for the sector data and the header information, and other similar types of information.

11 Claims, 14 Drawing Sheets

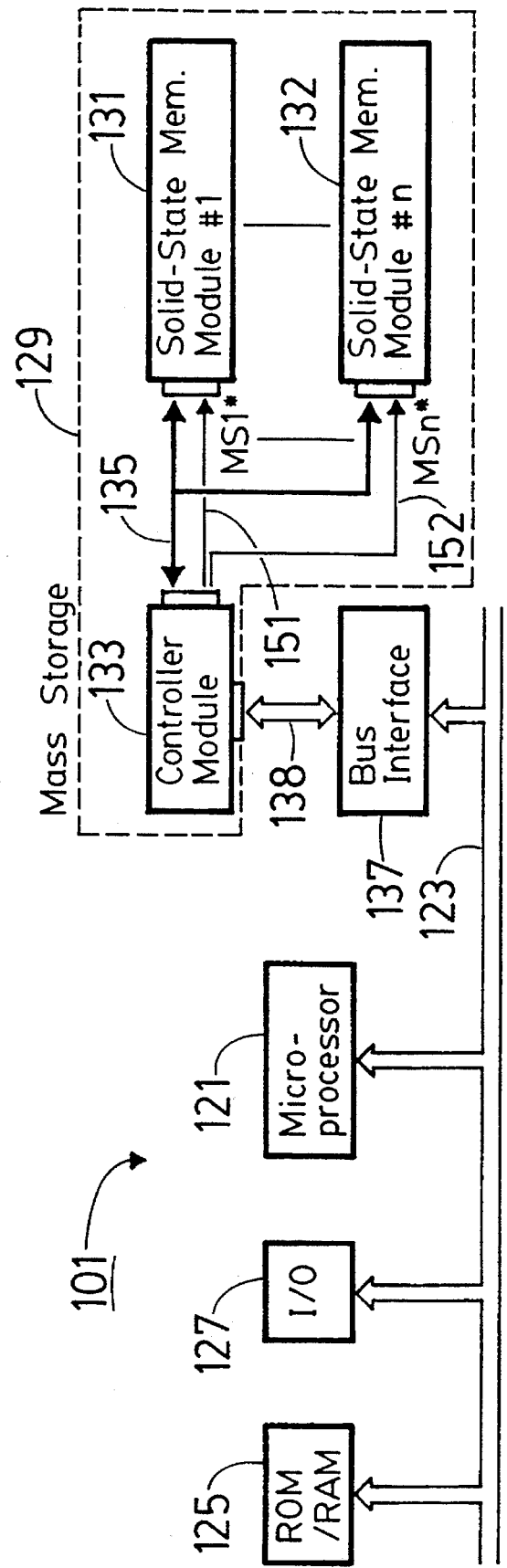
FIG._1.

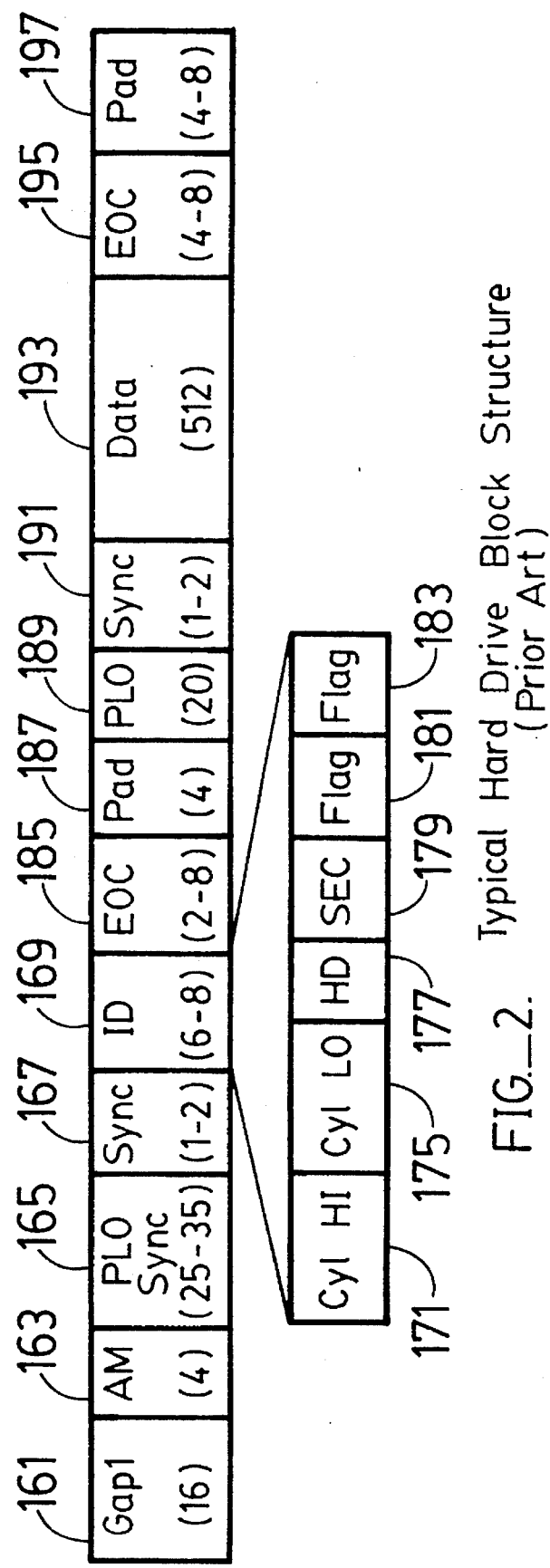
FIG._2. Typical Hard Drive Block Structure (Prior Art)

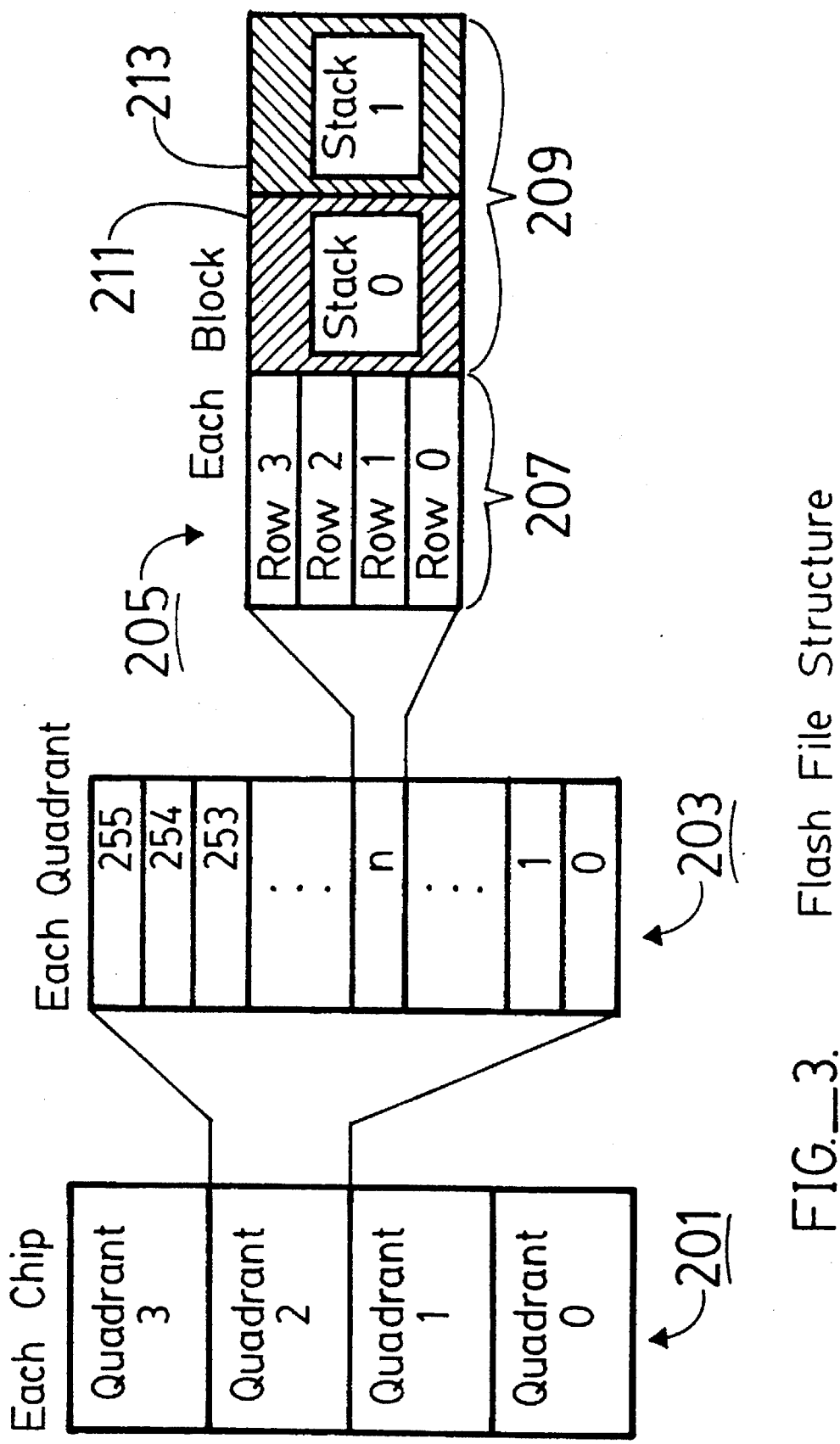
FIG._3.   Flash File Structure

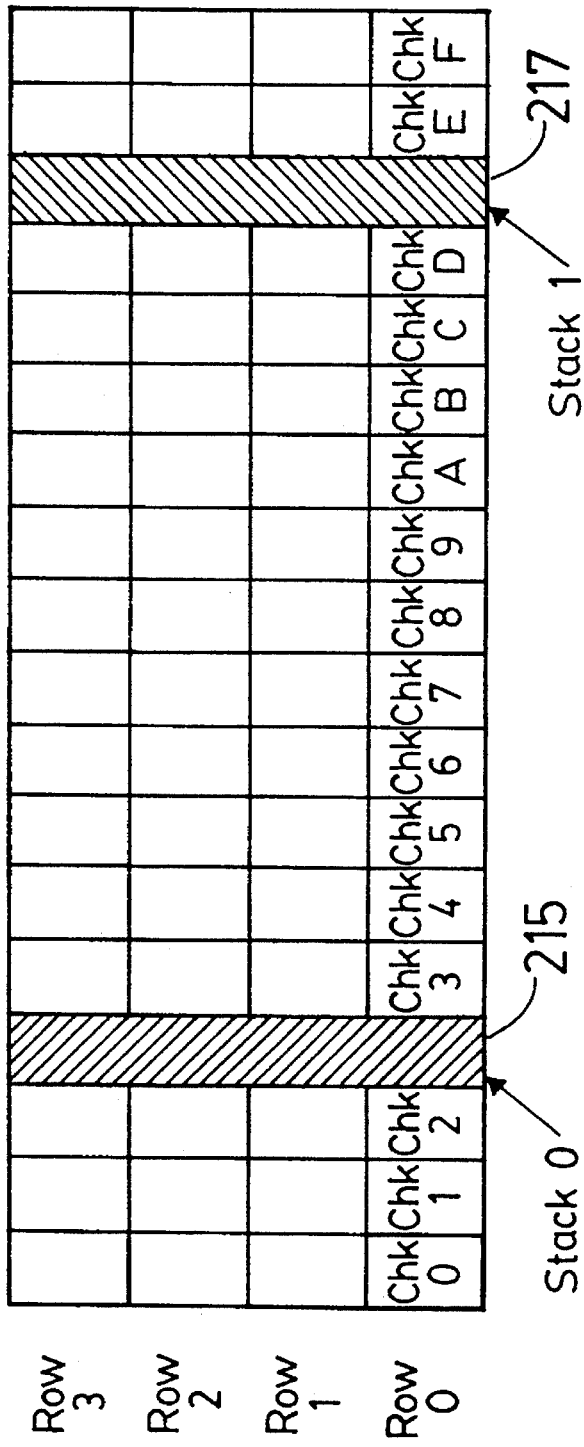
FIG._4. Detailed Block (Sector) Structure

Stack 1 (217)

| | |
|---|---|
| Row 3 ECC | Row 3 – Spare Data Bits (Bad Bit/Column Replacements) — 225 |
| Row 2 ECC | Row 2 – Spare Data Bits (Bad Bit/Column Replacements) — 223 |
| Row 1 ECC | Row 1 – Spare Data Bits (Bad Bit/Column Replacements) — 221 |
| Row 0 ECC | Row 0 – Spare Data Bits (Bad Bit/Column Replacements) — 219 |

Row 3 Chunk x — 233
Row 2 Chunk x — 231
Row 1 Chunk x — 229
Row 0 Chunk x — 227

Note: A stack is made of the same 4 chunks of each row in a sector block. Each chunk is 64 bits.

FIG._5.   Stack 1 Details

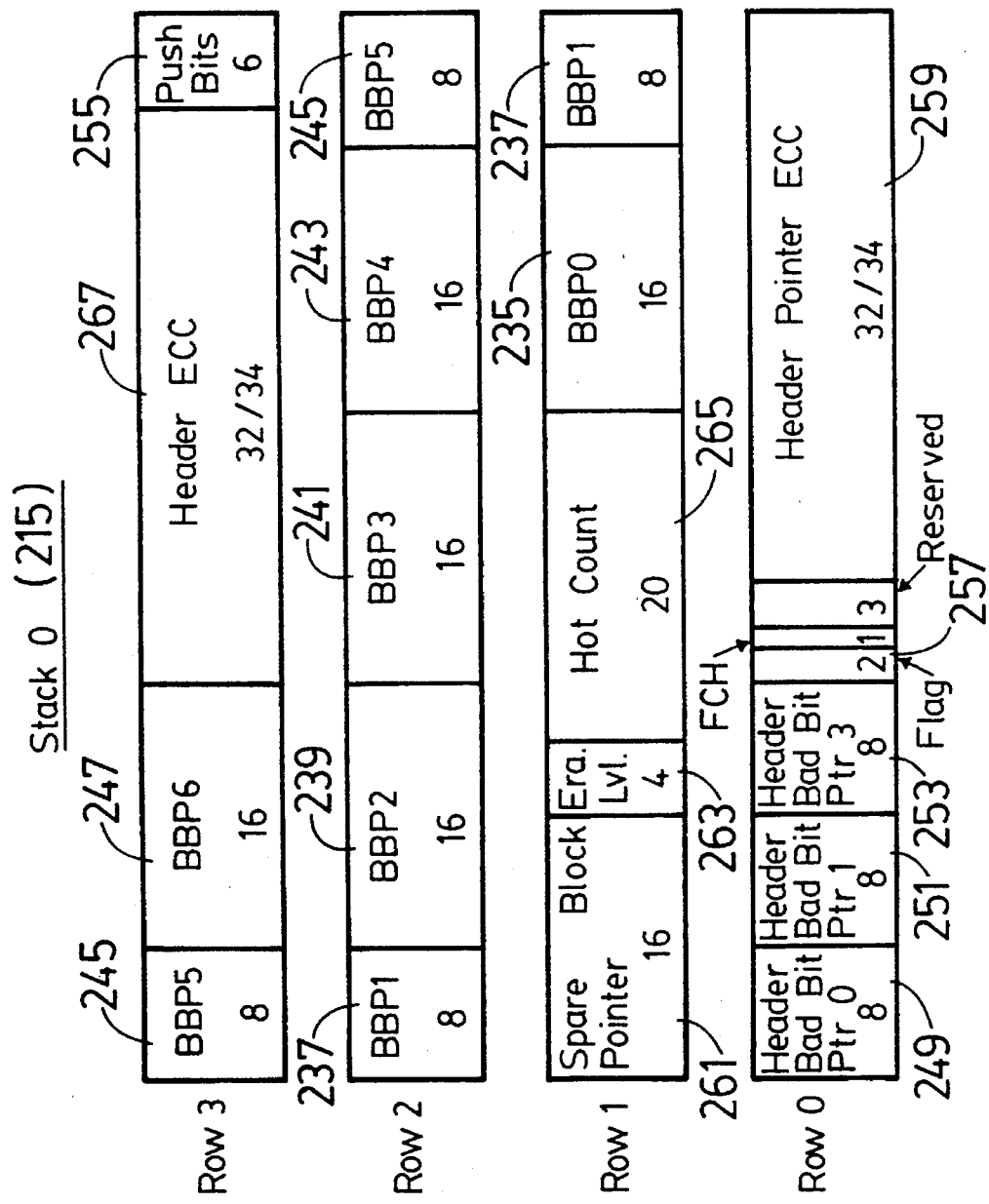
FIG._6. Stack 0 Details

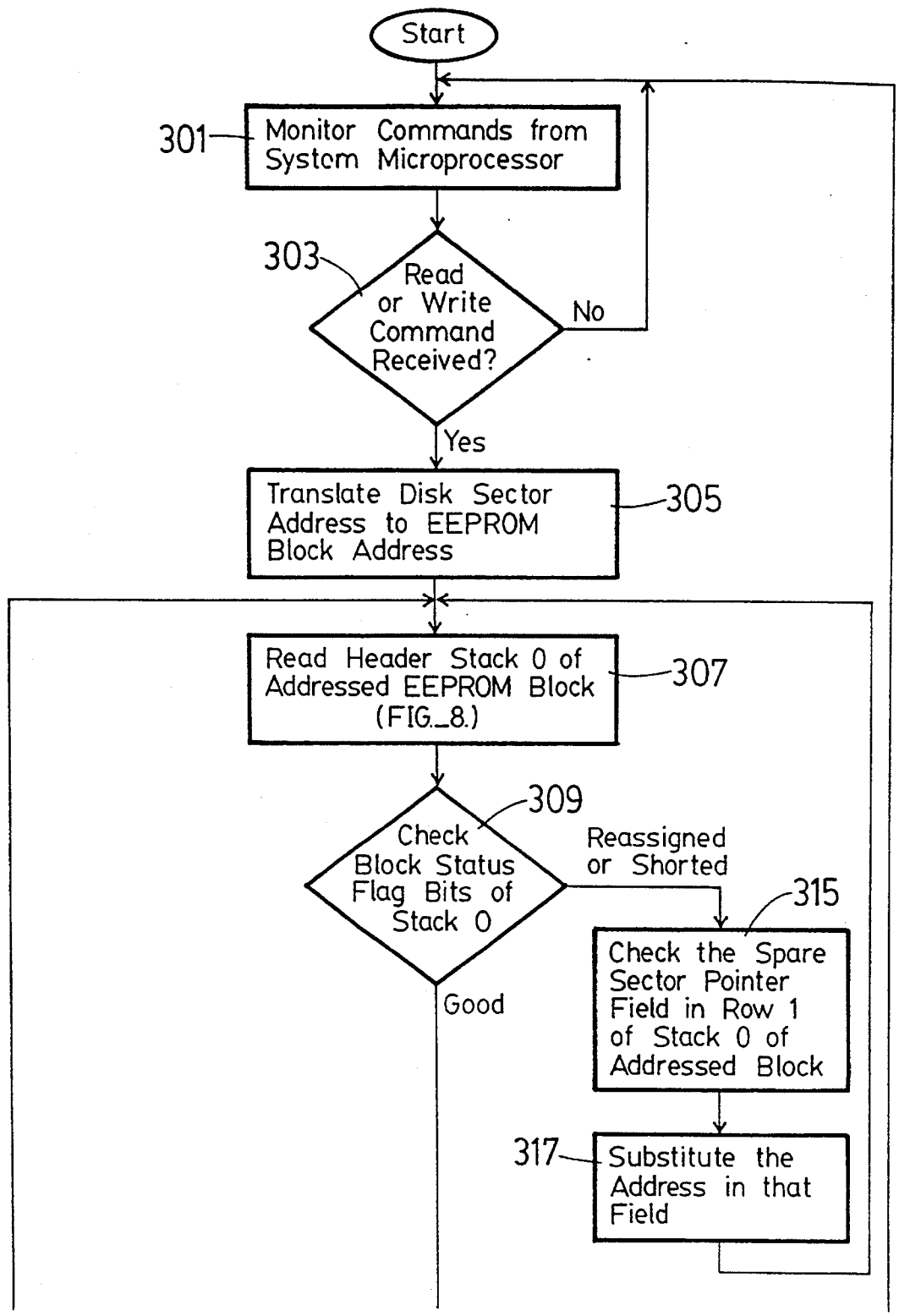
FIG._7-A

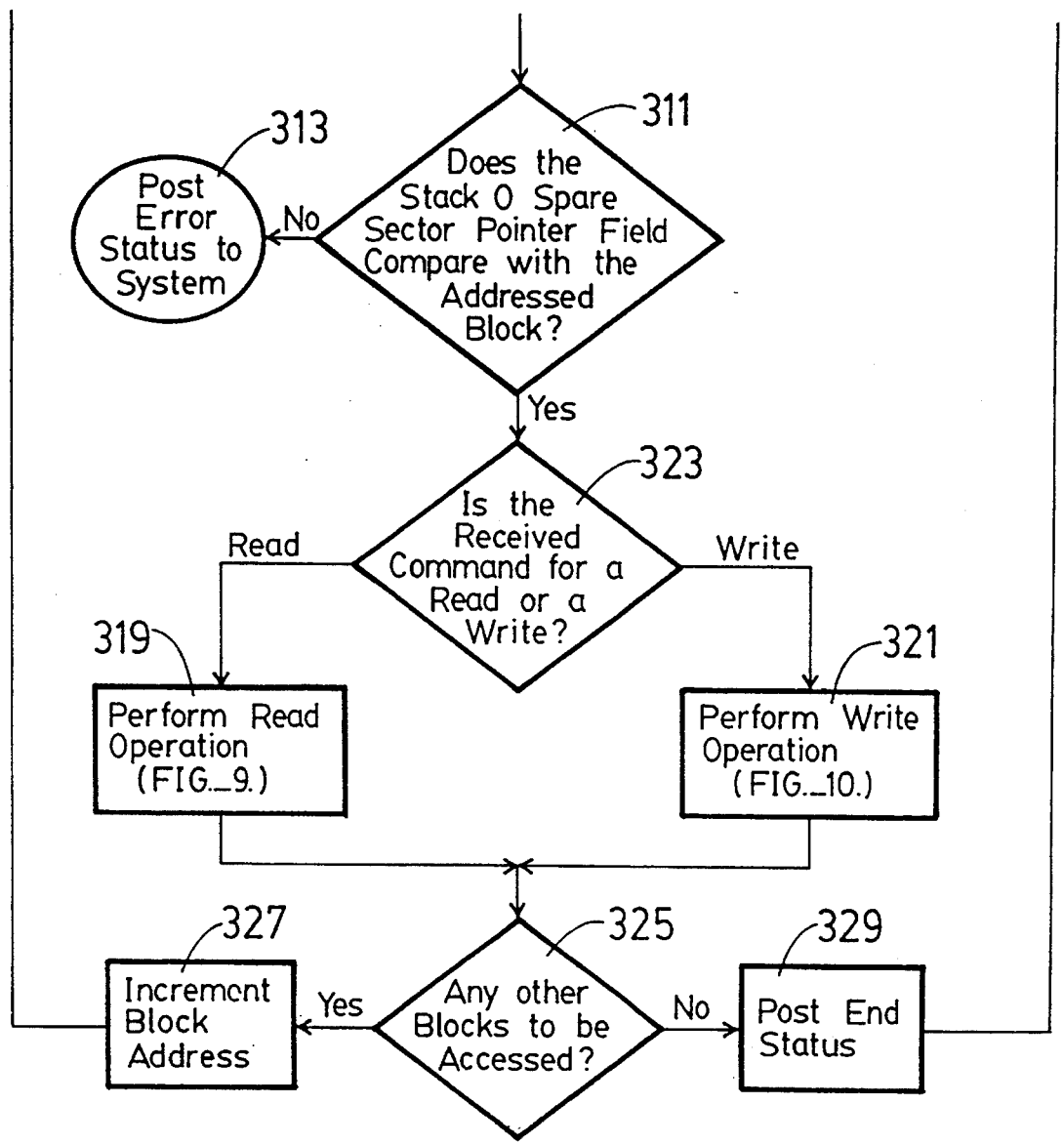
Overall Read/Write Process
FIG._7-B

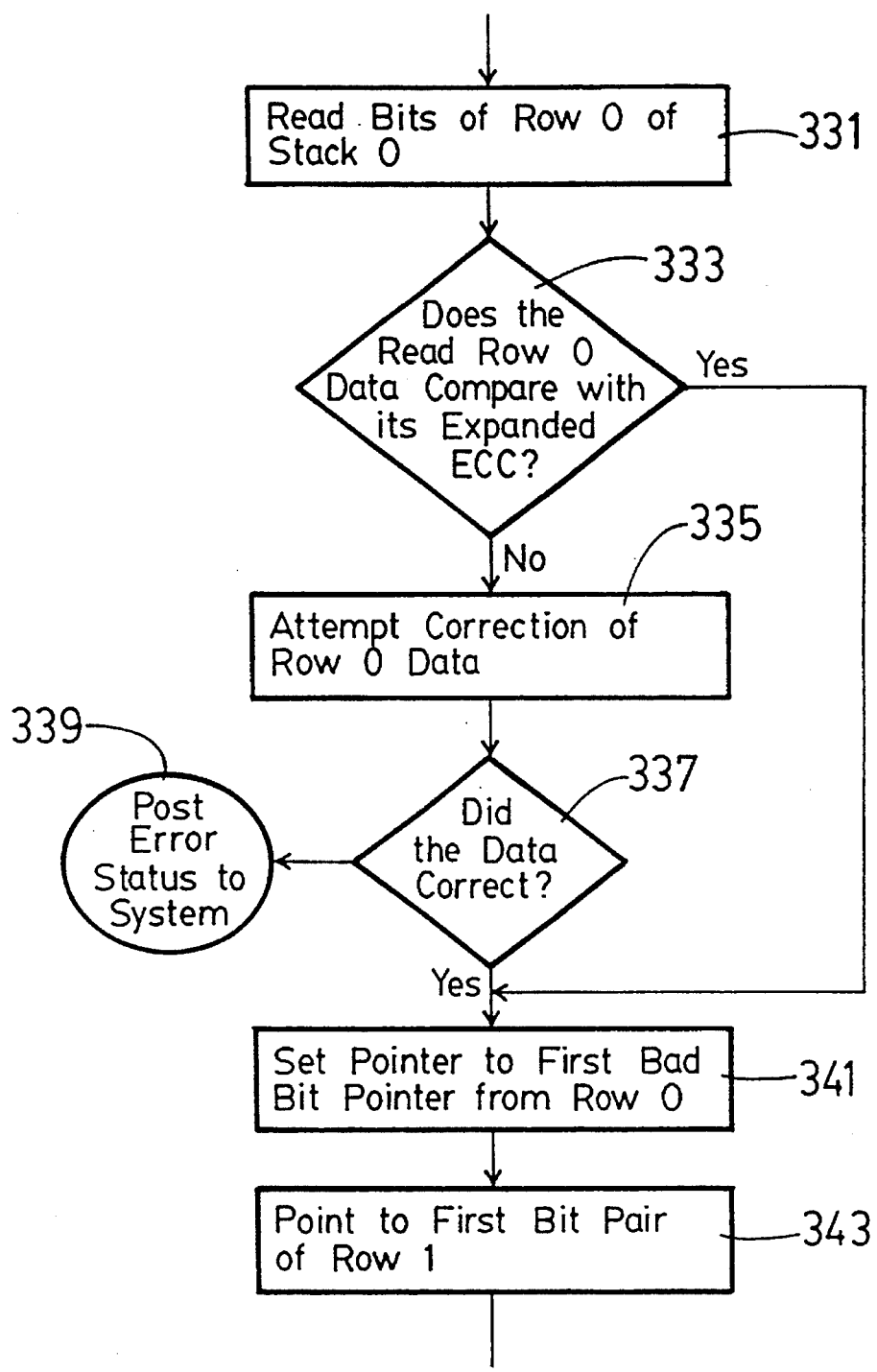
FIG._8-A

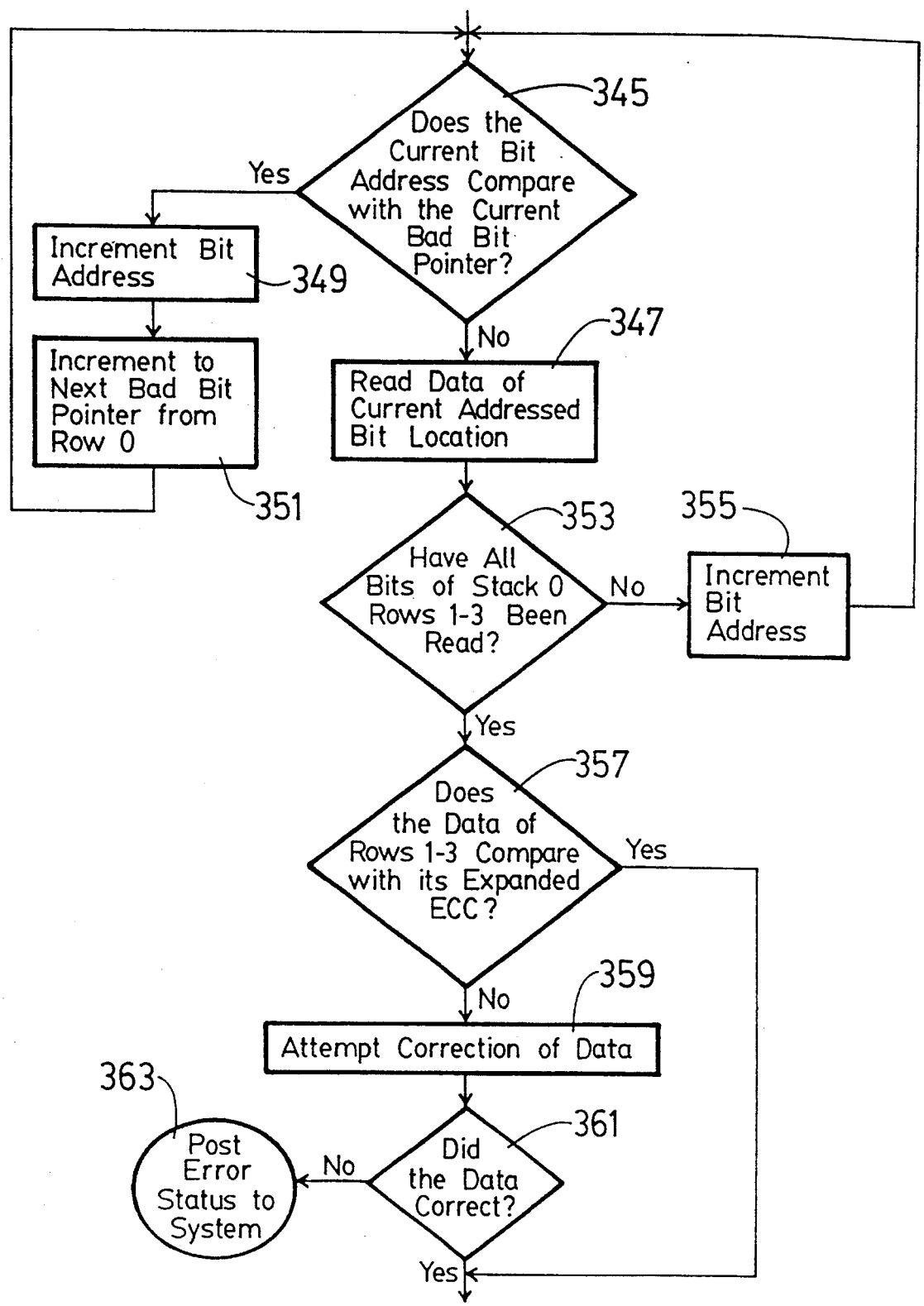
Stack 0 Read Process
FIG._8-B

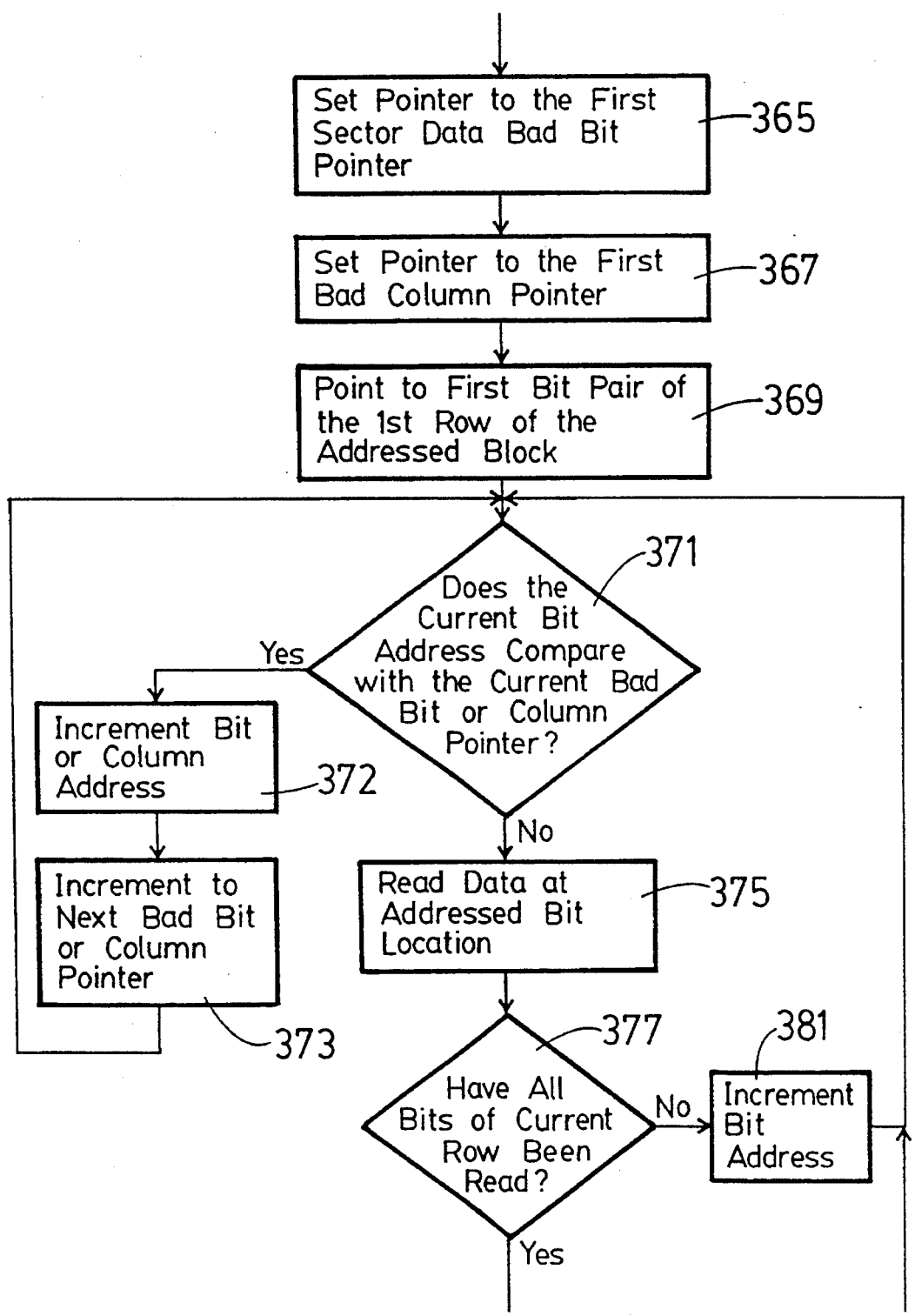
FIG._9-A

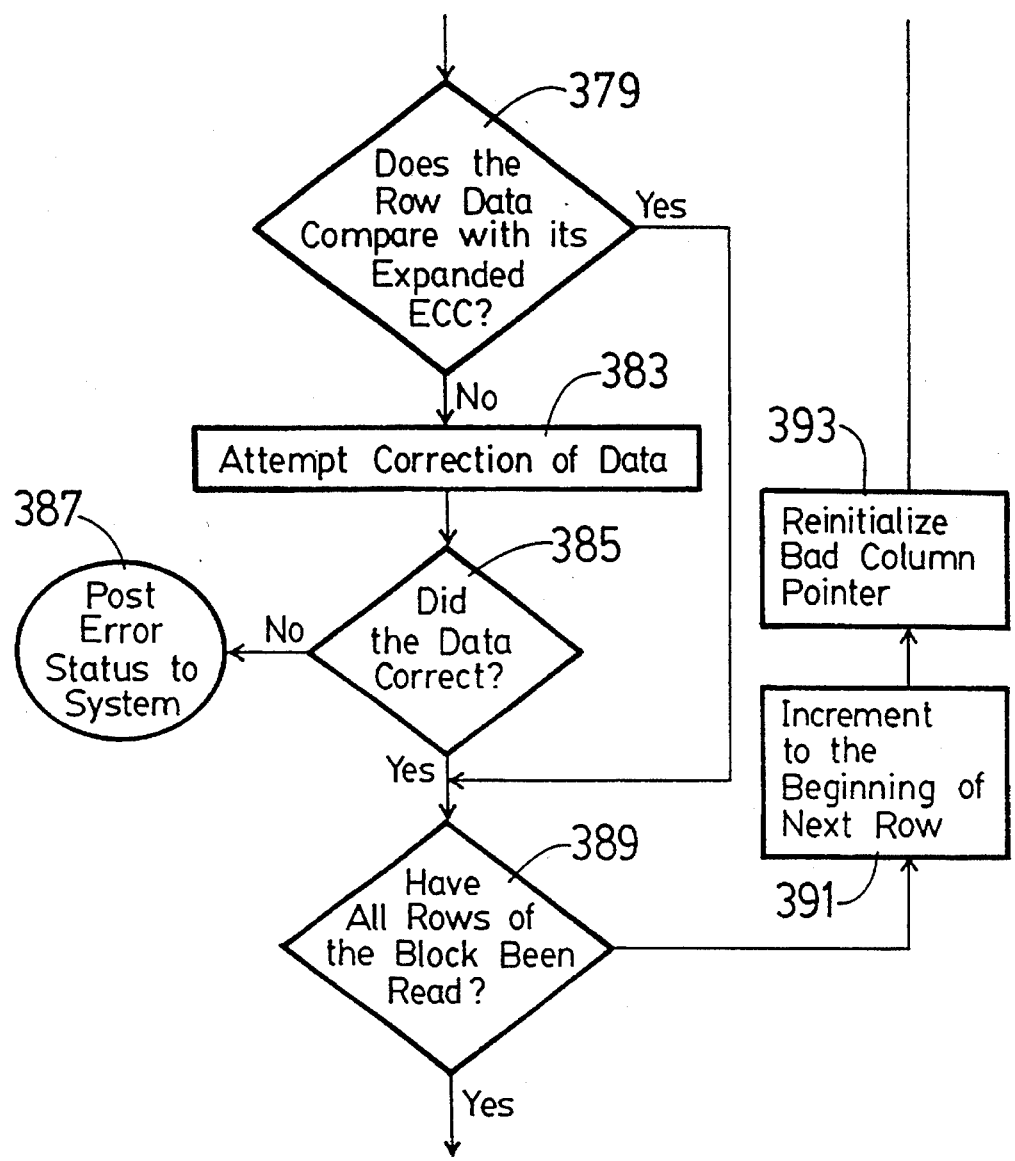
Read Data Process
FIG._9-B

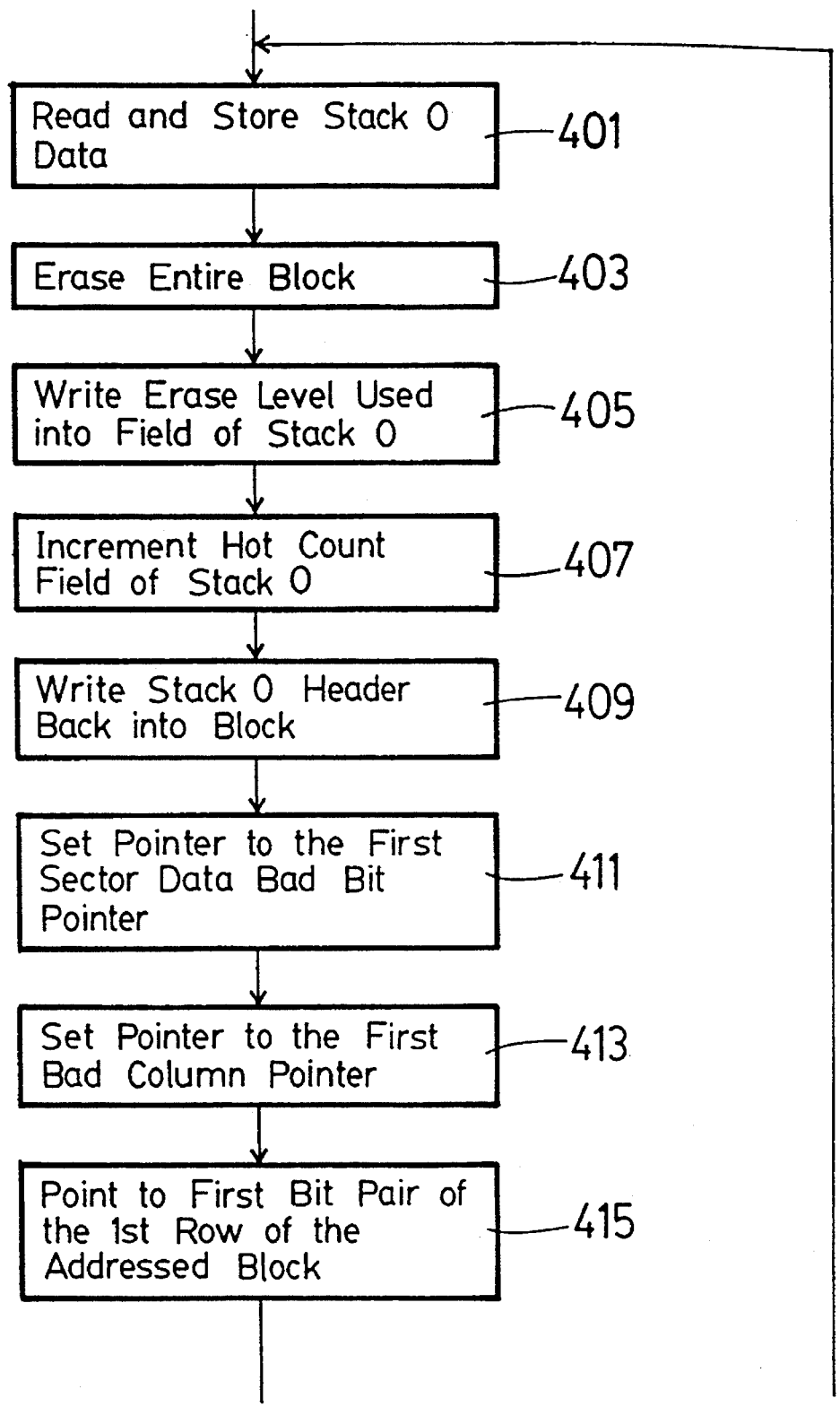
FIG._10-A

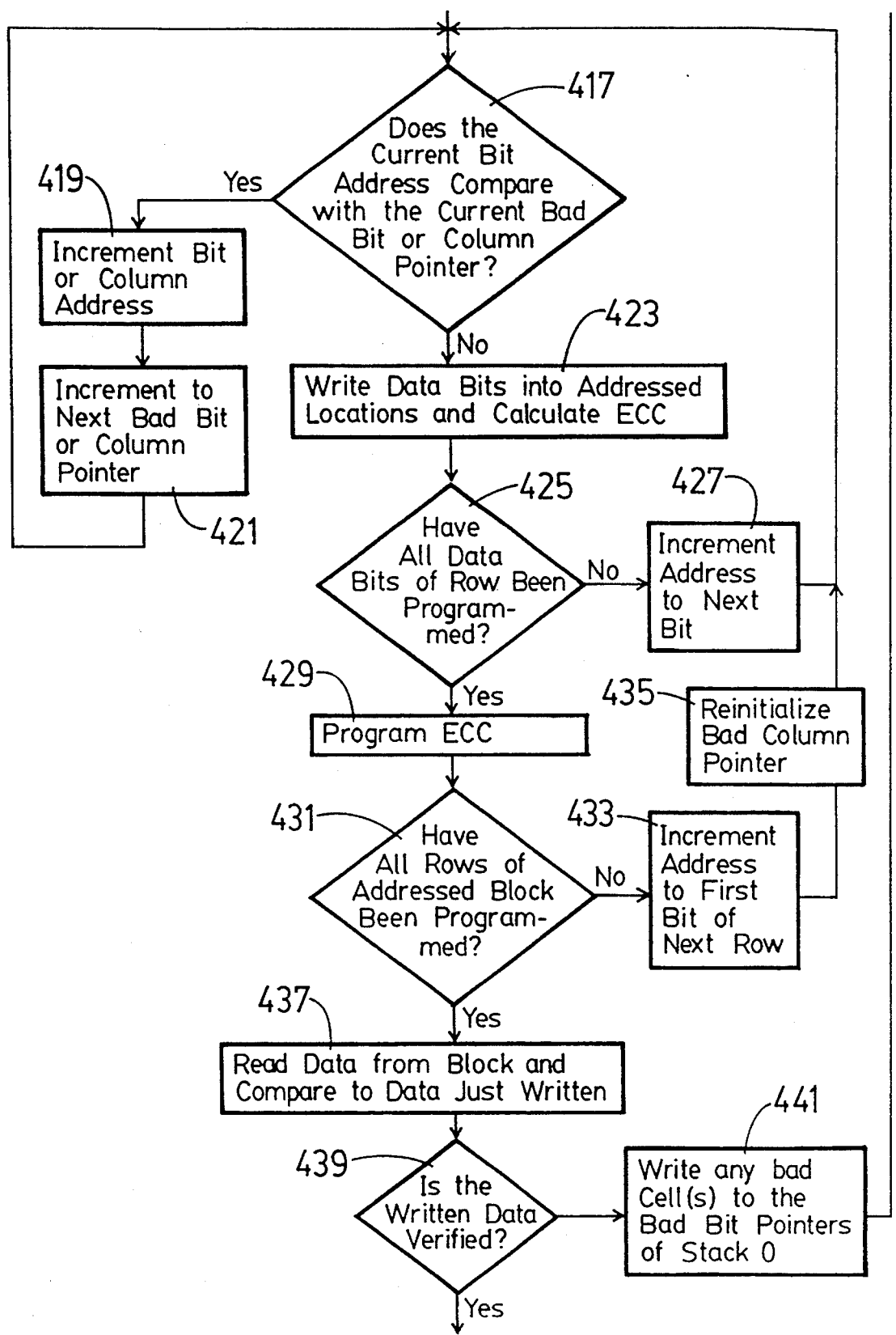
Write Data Process     FIG._10-B

FLASH EEPROM ARRAY DATA AND HEADER FILE STRUCTURE

CROSS-REFERENCE TO RELATED APPLICATIONS

This is a continuation of application Ser. No. 08/252,052, filed Jun. 1, 1994, now U.S. Pat. No. 5,438,573, which in turn is a continuation of application Ser. No. 07/759,497, filed Sep. 13, 1991, now abandoned.

BACKGROUND OF THE INVENTION

This invention relates generally to solid state mass storage systems, and, more specifically, to a file structure for storing data in such systems.

Low cost mass computer storage systems have traditionally used mechanical devices employing magnetic storage media, such as hard disk drives, floppy disk drives and tape. Such memory systems have been very effective and have provided a large amount of data storage capacity at a low cost for use in computer systems. However, there are certain drawbacks to the mechanical/magnetic media systems that have limited development of computer systems and their applications. The mechanical systems lack desired ruggedness for certain applications, such as portable computers, have a limited life due to mechanical wear, and require significant amounts of power to operate them, again a disadvantage in portable computer systems.

As a result, large solid state memory systems have been proposed and have been developed for replacing hard and floppy disk drives. The most promising solid state technology is electrically erasable and programmable read only memory ("EEPROM"). This technology provides non-volatile memory that can be erased and reprogrammed tens of thousands of times. A flash EEPROM system allows erasure of the entire memory or designated portion of the memory at one time, i.e., in a "flash".

It is desirable that such a flash EEPROM memory system be able to communicate with a computer system of which it is a part as if the memory is a disk drive. That is, since computer circuitry and operating software for communicating with a hard disk drive, for example, has been fully developed as an industry standard interface for mass storage of data, it is desirable that a flash EEPROM memory system also communicate with the computer system in the same manner. Much of the control and status communication between a computer system and a hard disk drive is not applicable for a flash EEPROM system, while other control and status information is necessary but must be changed in form. An appropriate controller is provided as part of flash EEPROM system for providing that translation.

A usual disk drive records data from the computer system in physical sectors having a certain capacity, such as 512 bytes, plus a large number of bytes that go along with each sector of data as a header to identify control information about the sector of data and its disk location (address). It is also desirable in a flash EEPROM memory system to store data in blocks and provide header information as part of each block. Therefore, it is a principal object of the present invention to provide a data and header block file storage technique in a flash EEPROM mass storage system that takes full advantage of the capabilities of the EEPROM technology, but without retaining limitations of the disk storage technology.

SUMMARY OF THE INVENTION

This and other objects are accomplished by the various aspects of the present invention, wherein, briefly and generally, integral blocks that each contain a sector of data and header information are stored in blocks of memory cells which are simultaneously erasable upon the block itself being addressed. The header includes block identifying information in terms appropriate for a solid state memory and error detection/correction codes for the sector of data in the header information. Spare cells are provided as part of the header to replace any defective cells in the data sector portion of the block, pointers also being included in the header to identify the bad cell locations which are then replaced by one of the spare cells. Other header information includes a field containing a count of the number of times the block has been erased and the voltage level used during the last successful erase of the block. A header is also provided with a field containing a pointer to another block in the case where the current block has so many defective cells that it cannot store the required number of bits. Certain header information is read by the memory controller preceding a read, write or erase operation being performed on the block.

In a preferred form of the flash EEPROM file structure according to the present invention, the blocks are each formed from a plurality of contiguously addressable rows of memory cells extending across the same contiguously addressable columns of a two-dimensional array of cells. The header is formed from certain columns in each of the block's row. A number of spare cells are provided in each row of the header that are used to replace any defective cells of the data sector in that row. Additionally, an error correction code for each row of data is preferably stored as part of the header area in each of those rows. One or more error correction codes is also desirable for at least some of the header information itself and is also stored as part of the header. A few spare cells can also be provided as part of the header with pointers therein to bad cell addresses which are then replaced by the spare cells. In order to improve the probability that the header fields will be located in areas that do not have bad cells, the header is, according to a preferred embodiment, implemented in two narrow portions that can be separately positioned, one portion containing the spare cells for each data sector row and an error correction code for data of that row, while the other header portion contains various block identification information described above.

Additional objects, features and advantages of the various aspects of the present invention can be had from the following description of its preferred embodiment, which description should be taken in conjunction with the accompanying drawings.

BRIEF DESCRIPTION OF THE DRAWINGS

FIG. 1 is a schematic block diagram illustrating a flash EEPROM system in which the file structure of the present invention may be utilized;

FIG. 2 shows a typical prior art hard disk drive data block structure;

FIG. 3 illustrates organization of the memory in the system of FIG. 1;

FIG. 4 shows further details of a preferred organization of the memory illustrated in FIGS. 1 and 3;

FIG. 5 illustrates the type of information stored in one of the header portions shown in FIG. 4;

FIG. 6 illustrates the type of information stored in another of the header portions shown in FIG. 4;

FIGS. 7A and 7B are a flow diagram that illustrates generally the operation of the controller module of the memory system of FIG. 1 when utilizing a file structure shown in FIGS. 3–6;

FIG. 8 is a flow diagram that amplifies a block of FIG. 7 to show the process of reading one of the header portions;

FIG. 9 is a flow diagram that shows the data reading process block of FIG. 7; and, FIG. 10 is a flow diagram that shows the data writing process block of FIG. 7.

DESCRIPTION OF A PREFERRED EMBODIMENT

Before proceeding to describe the flash EEPROM memory file structure in detail, a typical memory system utilizing such a file structure is discussed with respect to FIG. 1. A computer system 101 has an architecture that includes a microprocessor 121 connected to a system bus 123, along with a random access, main system memory 125, and one or more input-output devices 127, such as utilized with a keyboard, monitor, modem and the like. Another main computer system component that is connected to a typical computer system bus 123 is a large amount of long-term, non-volatile memory 129. Conventionally, such mass data storage is provided by a hard disk drive having a capacity of tens of megabytes of data storage.

In this case, however, the mass memory 129 includes one or more solid state memory modules, such as modules 131 and 132, which are under the control of a controller module 133. Each of the memory modules 131, 132, etc., includes at least one, but preferably several, such as four, flash EEPROM integrated circuit chips. Addresses, data, commands and status signals are communicated between the memory modules 131, 132, etc., and the controller module 133 by way of a device bus 135. Individual modules are selected by control signals in respective circuits 151, 152, etc. The controller module 133 is connected to a bus interface circuit 137 by means of an interface bus 138. The interface circuits 137 are connected, on the other hand, to the computer system bus 123. For personal computer systems, the bus interface 135 preferably conforms to the integrated device electronics ("IDE") standard.

Additional details of the mass storage memory system 129 and variations of it are provided in a co-pending patent application Ser. No. 07/736,733, filed Jul. 26, 1991, entitled "Device and Method for Controlling Solid-State Memory System", and naming Robert D. Norman, Karl Lofgren, Jeff Stai, Anil Gupta and Sanjay Mehrotra as inventors, which is incorporated herein by this reference. The physical form of the mass storage memory 129 can be a very small memory card conforming to existing physical and electrical interface requirements, or in a package sized to be substantially the same as that of a hard disk drive, thereby being directly replaceable for the disk drive, or the like.

Before proceeding to a description of the preferred flash EEPROM file structure for use in the system of FIG. 1, a typical data structure for hard disks is summarized. Data is stored on magnetic surfaces of hard disk along a plurality of concentric tracks that are usually defined in terms of an intersection of a plurality of concentric cylinders with the disk surfaces. A specific track is usually specified by identifying the read/write head to be utilized and the cylinder in which the data is recorded. Each of the tracks is further divided around its circumference into blocks, such as 17 blocks per track, each of which includes a sector of data, such as 512 bytes according to the most popular standard, along with header information. A single data read or write operation generally involves access to a large number of sequential located blocks.

FIG. 2 illustrates the file structure for a typical hard drive block. A GAP1 field 161 is typically 16 bytes in length and is used for controller overhead and speed variations. A next field 163 includes the address mark ("AM") which is typically 4 bytes in size and is specially decoded to tell the controller that it is entering a field of zeros. A PLO SYNC field 165, typically 25–35 bytes in size, contains a special pattern, normally zeroes, which is used by the controller to turn on a phase lock loop for clock alignment and generation. A next field 167 is a SYNC one byte or two bytes that is used by the controller in obtaining bit alignment.

A next field 169 of a typical hard drive data block structure provides identification for use by the controller to verify positioning in the drive. It is typically 6 to 8 bytes in length. Subfields within the portion 169 include cylinder high and low fields 171 and 173 which together define the disk cylinder location of the present block. A subfield 177 specifies the head that is being used. Another subfield 179 defines the sector location of the subject block. Additional bytes 181 and 183 are used as flags to the controller. These flags carry information as to the usage of the sector block being read. Typical information is whether the block is good, is a spare, or if defective, and where the spare is located. These flags only point to block types of failures and do not allow for defect handling within the block itself.

A next field 185 of the hard block structure of FIG. 2 is an error detection/correction code ("ECC"), typically 2–8 bytes in length. Following that is a PAD field 187, typically 4 bytes, that is used for write splice turn on or off. A next portion 189 includes another PLO field used to resynchronize the phase lock loop after a write splice. Following that is a 1 or 2 byte SYNC field 191. The data being transferred, typically a 512 byte sector, is included in a portion 193, followed by another error correction code 195 and another PAD field 197 of 4 to 8 bytes in the usual case. The second PAD field 197 is used to support write splice turn off and spin speed variations. There are many variations of the format described with respect to FIG. 2 but this is being described as typical, by way of background.

Before describing the flash EEPROM file structure, which is significantly different than that described with respect to FIG. 2, it is interesting to note which parts of the hard drive block structure that are used to operate the solid state memory. The controller module 133 (FIG. 1) receives a block data transfer with such a format. The controller ignores, however, all of it except for the identification portion 169, the EECs 185 and 195, and, of course, the data 193. All other fields of the FIG. 2 block structure have something to do with mechanical aspects of the disk drive, and so are unnecessary in a solid state memory. The block identification information field 169, in effect, provides an address of the data block in disk drive terms which is received by the controller 133 and translated by it into a solid state memory block address, as described hereinafter. The ECCs 185 and 195 are used by the controller to check the accuracy of the data transferred into its buffer memory from the computer system bus, but then create and store in the solid state memory additional ECCs, as described hereinafter.

In a preferred physical arrangement, as schematically illustrated in FIG. 3, each of the individual EEPROM integrated circuit chips in the memory modules 131, 132, etc., has its memory cells arranged in four quadrants. The quadrants of a circuit chip 201 is indicated in FIG. 3. The organization of each of the chip quadrants is shown at 203, containing, in this example, 256 blocks. The organization of one of these blocks is indicated at 205. The EEPROM cells are logically arranged in addressable rows and columns, as is typical for solid state memories. The memory organization illustrated herein also provides the memory cells physically arranged in such a row and column configuration but such a physical arrangement is unnecessary so long as the individual cells can be addressed by applying appropriate voltages to the correct row drive lines and column bit lines of the array.

In a preferred arrangement 205 of a typical block, a plurality of rows of cells, in this case four rows, are used. Each row extends across the same group of columns. The block is divided into two major portions, a data sector 207 and an overhead portion 209. Each of the two portions 207 and 209 extends across all four rows of the block with common column addresses. The overhead portion 209 is divided into two stacks 211 and 213, each stack occupying a small number of the same columns of each of the rows of the block. The overhead groups of cells are said to be organized into a "stack" since portions of each row are stacked on each other. Each of the two stacks is preferably read separately, the cells in one row being read, followed by those in the next row, and so on. Data in the sector 207 is preferably read in a similar manner, one row at a time, the row portions included in the stacks being skipped.

The memory system of FIG. 1, in a preferred implementation, transfers data between the controller and EEPROM chip modules in eight byte chunks. Therefore, it is useful to show the organization of a block in terms of such chunks. With reference to FIG. 4, a memory block includes four rows of 18 chunks each. One chunk of each row at the same column address forms an overhead stack 215 and another vertically arranged group of chunks, one from each row, forms another stack 217. The remaining chunks shown unshaded in FIG. 4 hold the 512 bytes of sector data. By making the stacks 215 and 217 narrow, and by making them positionable away from each other in any of the chunk columns illustrated, it can be assured that at least the critical portions of the stacks are formed where there are no defective EEPROM cells. A primary characteristic of each of the blocks of the quadrant 203 (FIG. 3) is that all of the memory cells in that block are erasable at the same time by an erase pulse applied to a single addressed block.

It is unfortunately a fact of life that the memory will have certain defective cells upon manufacture and may develop others during use. In order to accommodate bad cells in the data sector region of a block, several spares are provided in each of the four rows of the block within the stack region 217. This is illustrated by spare cells 219, 221, 223 and 225 of FIG. 5. Also provided in each row is a field to store an ECC calculated from the data stored in the sector data cells of that same row. Referring to FIG. 5, a field 227 is provided for one of the rows, 229 for another, 231 for another and 233 for the last row of the block. The usual approach in mass storage systems is to calculate a single ECC for an entire sector of data of the size being discussed. The calculation and storage as part of the data block of four ECCs, one for each row, improves the system ability to determine when bad data exists and to then correct it.

In order to handle individual bad cells in the data sector portion of the block, seven bad bit pointer ("BBP") fields 235, 237, 239, 241, 243, 245 and 247 are provided. These fields are used to store the address of bad data sector cells within the same block. These pointers are loaded in the fields 235–247 in the same order as their corresponding bad cells are reached during sequentially addressing each of the cells, or pair of cells, in along each of the four rows of the data sector portion of the block. Their use is described more specifically hereinafter with respect to the process flow diagrams.

The stack 215 also has the ability to operate properly with a few bad cells in it. Fields 249, 251 and 253 can accept pointers to certain cell addresses within the stack 215. Six spare cells in an area 255 are provided in row 3. The stacks are read by addressing each cell, or a pair of cells simultaneously, in order from left to right across row 0, and then from left to right across row 1, and so forth. If a bad cell exists somewhere in rows 1–3, that cell is simply skipped during a reading or writing operation, and the bits thereafter are shifted a pair of cells in address, thereby using one of the spare cells of the area 255. If a second bad cell exists, a pointer is stored in the field 251 that indicates the bad cell address and the same bit mapping occurs.

The bad bit pointers stored in the stack 215 are loaded during a testing procedure of each EEPROM chip by the manufacturer. Any cells which are defective, because of an electrical short or for some other reason, are mapped out of the system by storing an appropriate pointer in one of the bad bit pointer fields described with respect to FIG. 6. It is important, however, for the file structure being described, that row 0 of stack 215 be located in a portion of the memory block where no defective cells exist. This is made possible because of the ability to move the stacks 215 and 217 from left to right (FIG. 4) by appropriately noting their chunk column addresses in the controller 133.

Another field 257 of row 0 of the stack 215 identifies whether the block in which the stack 215 exists is being used for data storage, or whether it has been reassigned. A field 259 of row 0 contains an ECC calculated from the remaining information stored in that row. The maximum possible care is taken to assure that the header bad bit pointers of fields 249–253 and the flag of field 257 are accurate.

Three additional fields are provided in row 1 of the stack 215. A field 261 contains either the address of the current block or, in case the flag in field 257 indicates that the current block is has been reassigned, contains the address of a substitute block that is to be used in its place. As pointed out below with respect to the flow chart of FIG. 7, the occurrence of an address of another block in the field 261 causes that other block to be accessed in its place.

A field 263 contains a number that indicates the erase voltage used during the last erase cycle on this particular block. In the process of being erased and rewritten tens of thousands of times, the EEPROM cells require the erase voltage to be increased over its lifetime. The voltage which was necessary for a complete erase during the most recent cycle is stored in the field 263.

Another field of row 1 of the stack 215, indicated at 265, stores the number of times that the block has been put through an erase and reprogramming cycle. This information can also be used to set operational parameters.

A final field 267 of the stack 215, located in its row 3, contains an ECC for the information stored in rows 1, 2 and fields 245 and 247 of row 3. This separate ECC allows careful monitoring of the accuracy of the bits read from rows 1–3 which affect operation of the memory.

In order to better understand the nature of the file structure described with respect to FIGS. 3–6, and the use of the information stored in the stacks, a general operational flow diagram is provided as FIG. 7. As indicated by a step 301, the controller module 133 (FIG. 1) is constantly monitoring any commands from the host computer received by it over the bus 138. When a READ or WRITE command is received, as indicated by a step 303, the controller 133 then reads the address of a data block or blocks presented in disk drive terms by the computer system and translates that address to a corresponding block or blocks of EEPROM memory, as indicated at 305. This address translation is preferably carried out by an algorithm, where there is a one-to-one correspondence between disk and EEPROM memory block addresses, or by use of an appropriate look-up table.

Once a given memory block is addressed, its stack 215 is read, as indicated by a step 307. The flags in the field 257 are checked in a step 309 to determine whether the addressed block is good or not. If so, then the field 261 is read, as indicated by a step 311, to make sure that the block which the controller thinks it has addressed is indeed the block addressed. The address in the field 261 is compared with the logical address of the block being addressed by the controller. If it does not compare, an error message is sent, as indicated at 313, and the host computer system then responds appropriately.

If a check of the flag bits in field 257 by the step 309 reveals that the block has been reassigned, then, in a step 315, the field 261 is accessed to read the address of the substitute block. A step 317 then substitutes that new address for that of the current block, and the process proceeds back to step 307 which occurs on the new block.

Once a good block has been addressed, after a proper comparison of block addresses in the step 311, a read operation 319 or a write operation 321 occurs, depending upon the nature of the command from the host computer system that is detected in a step 323. Once the commanded read or write operation occurs, as indicated in a step 325, it is determined from the commands sent from the host computer whether there are any other blocks involved in the current read or write operation. Since each block operation results in transferring only 512 bytes of data, in this specific example, there are generally many blocks transferred, one at a time in sequence. These blocks are arranged in address sequence in disk drives, so a translation of those addresses to the EEPROM memory blocks results in contiguous blocks of solid state memory also being used. Therefore, if additional blocks are being transferred, a step 327 increments the block address to the next in order block and the process is begun again with the step 307 for that new block. If, on the other hand, only one block is transferred, or after all blocks of a multiple block transfer have been handled, a step 329 occurs. This step tells the host computer that the transfer has been completed, and the controller then returns to steps 301 and 303 to look for any further read or write commands from the host computer. When one is received, the process is begun again at the top of FIG. 7.

Three of the process blocks of FIG. 7 are expanded in FIGS. 8–10. Referring to FIG. 8, the step 307 of FIG. 7 is shown in more detail. A step 331 first causes row 0 of the stack 215 (FIG. 6) to be read. As part of that reading operation, the ECC stored in the field 259 is expanded by running it through the ECC polynomial being used and the resulting data is compared in a step 333 with that of the other fields of row 0. If a mismatch of one or more bits occurs, a correction is attempted, as indicated in step 335, but, as indicated in a step 337, if the correction does not work, an error status flag is posted to the computer system, as shown in a step 339. The ECC technique utilized may be a standard forward and reverse polynomial of a common type used in hard disk drive data transfers.

If the data read from row 0 of the stack 215 is satisfactory, a next step 341 sets a compare function in the controller to include the pointer in the field 249 of row 0 of stack 215. A next step 343 then points to one or more bits in row 1 of the stack 215 which are to be read at the same time. In the example being described, data is transferred between the controller and the EEPROM chips a pair at a time. A comparison indicated at a step 345 looks to see if the addresses of the bit pair include that of the bad bit pointer in field 249 (FIG. 6). If not, the pair of bits is read, as indicated in a step 347. If, on the other hand, the addressed bits of row 1 include that of the field 249 pointer, a step 349 increments the bit address to the next bit pair in sequence along row 1. Since the bad bit indicated in field 241 has now been passed, the next bad bit pointer in a field 251 is, in a step 351, appropriately accessed and the process begins again with the step 345.

The result of incrementing the address is to skip over reading the bad bit, meaning that each of the bits in the rows 1–3 has been relocated one bit to the right of that indicated in FIG. 6, thus to include one of the spare bits in the field 255.

After each successful read of a pair of bits, a step 353 determines whether that read was the of the last bit pair of the stack 215. If not, the bit address is incremented in a step 355 and the process begins again with step 345 for that new address. Once all the bits have been read from the stack 215, however, a step 357 then expands the ECC in the field 267 and compares it with the data just read in rows 1, 2 and 3 of the stack 215. A step 359 indicates the usual attempt to correct that data, with a check at step 361 as to whether the data was corrected. If not, an error status is posted, in a step 363. If, of course, the result of the step 355 is a positive comparison of the data, the steps 359 and 361 are skipped.

Referring to FIG. 9, the process of reading sector data of the step 319 of FIG. 7 is shown in more detail. Certain common operations of the process of FIG. 9 with that described with respect to FIG. 8 will be referenced. A first step 365 sets the current controller compare circuitry to the first sector data bad bit pointer stored in the field 235 of the stack 215. In parallel with that, another portion of the current controller compare circuitry is set to a pointer that identifies the first bad column of the block being read, if any, as indicated by a step 367. Since it is not uncommon for an entire column of memory cells to be rendered inoperable by a short or other defect in its column bit line, it is easier to keep track of that column in a single pointer instead of storing a number of pointers to all of the individual cells in the defective column. The bad column pointers can be included as part of each block, as are the bad bit pointers, but in this example are stored in a separate group of sectors duplicated within the memory array for this purpose.

A next step 369 then points to the first bit pair of the first row of the addressed block in its data sector portion (that is, memory cells outside of the stacks). If that data address pointer compares with either of the bad bit or column pointers, as indicated by a decision step 371, then the address is incremented by one in a step 372 and the next bad bit or column pointer, depending upon which caused the match in step 371, is set in a step 373 for the next address comparison.

If, however, there is no such positive address compare in the step 371, the data in the addressed cells is read, as indicated at 375. At the end of a data sector row, having skipped the chunk within the stack, as determined by step 377, the ECC for that row, which is stored in the stack 217, is then compared with the data in a step 379. However, if there are additional bits of the data sector row that need to be read, the bit address is incremented, as indicated by a step 381, and the process returns to the decision block 371 for the new cell locations.

As is usual with an ECC, a step 383 follows if the expanded ECC does not compare with the data. A correction of that data is attempted in that step. If the data cannot be corrected, as indicated by a step 385, then an error status is sent to the host computer system, as indicated at 387. If the data is corrected, or if the expanded ECC does compare with the data in a step 379, a next step 389 determines whether all of the data sector rows of the current block have been read. If so, the read operation is complete and the process proceeds to the decision block 325 of FIG. 7. However, if all of the rows have not been read, then the bit pair address is incremented by a step 391 to the next row in sequence and the bad bit column pointer is reinitialized in a step 393 back to the first column in the block that will be encountered when incrementing along the row from column to column to read its data.

Referring to FIG. 10, a write operation 321 of FIG. 7 is shown in more detail. A first step 401 transfers the contents of the stack 215 into a buffer memory. The entire block is then erased, as indicated at 403, including the cells designated for the overhead stacks. This is preferably accomplished by a series of erase pulses simultaneously applied to each of the cells in the current block, with a read step occurring between the pulses to determine if the voltage of the cell has been reduced to an erased level. Once this occurs and all of the cells are erased, the erase level that was necessary to be used is written, in a step 405, into the field 263 of the stack 215 contents that are currently stored in buffer memory. As indicated by a step 407, the count in field 265 of the stack 215, as stored in the buffer, is also incremented to show this new cycle of erase and reprogramming. After that, the contents of the stack 215 are written back into the block of memory from the controller buffer memory, as indicated by a step 409.

The process of writing sector data into the block is then commenced. Steps 411, 413 and 415 correspond in function to steps 365, 367 and 369, respectively, described with respect to FIG. 9 for a read process. Similarly, a comparison step 417 and address and pointer steps 419 and 421 of the FIG. 10 write process correspond to respective steps 371, 372 and 373 of the FIG. 9 read process. When a bad bit or bad column is encountered in the sector data portion of the block as each pair of cells of a row are addressed in order, that defective cell or column is skipped. This results in the data sector then extending into the spare bits of the stack 217 for that row. The read process steps 371–373 of FIG. 9 then automatically result in skipping the same bad bits that are skipped by the steps 417–421 of the write process of FIG. 10.

Once a good sector data bit pair is found, data is written into it or them by a step 423. If all of the cells of a sector data row have not been written, as observed in a step 425, the row address is incremented in a step 427. Once all of the sector data cells in a row have been programmed, the ECC for that row of data has been calculated and now is written into the portion of the stack 217 for that row, per a step 429. The method step 429 for writing the ECC is the same as described above for data bits, wherein bad bit locations are skipped over during the write.

Once the ECC is calculated and stored for a given row of data, a decision 431 will cause the process to increment to the first bit pair of the next row, in a step 433, if all the rows have not yet been programmed. If this is the case, the bad bit column pointer is initialized, in a step 435, prior to beginning to write data into the next row.

Once all of the rows have been written, all of the sector data is read in a step 437 and compared with a copy of that data temporarily maintained in a controller buffer. Alternatively, this can be accomplished by a read with an ECC check. If the comparison is positive, a decision block 439 causes the process of writing data to end, the next step being indicated at 325 of FIG. 7. If the data does not compare, a step 441 identifies the bad cell or cells by address which are responsible for the bad bits, and then adds that address in the form of a bad bit pointer to the bad bit pointer fields 235–237 of the stack 215 in its proper order. This process dynamically and automatically takes a bad cell out of service without having to declare the entire block to be of out of service.

Although the various aspects of the present invention have been described with respect to a preferred embodiment, it will be understood that the invention is entitled to protection within the full scope of the appended claims.

It is claimed:

1. A method of operating a non-volatile memory system including an array of floating gate memory cells arranged in rows and columns and characterized by at least one type of defect in a column rendering inoperable all of the cells in that column, comprising:

operating the memory system with the rows of the array separated into unique blocks of cells that are individually addressable for simultaneous erasure of the cells within an addressed block, maintaining a list identifying any inoperable columns, designating a plurality of contiguous columns, not including a column on said list, for storage of at least one chunk of overhead data within the individual blocks and designating memory cells of columns other than those designated for overhead data for storage of a plurality of chunks of user data within the individual blocks, writing user data to and reading user data from memory cells, at least one chunk at a time, of the individual blocks that lie in columns designated for the storage of user data, and writing overhead data to and reading overhead data from memory cells, at least one chunk at a time, of the individual blocks that lie in columns designated for overhead data, said overhead data including information about the individual blocks themselves or any user data stored therein.

2. The method of claim 1 wherein the writing of user data to and reading user data from memory cells of the individual blocks includes addressing cells within said other columns by reference to said inoperable column list.

3. The method of claim 1 wherein the overhead data written to and read from individual blocks includes a flag that designates whether an addressed block is defective or not.

4. The method of claim 3 wherein the overhead data written to and read from individual blocks includes, when said flag indicates that an addressed block is defective, an address of a substitute block.

5. The method of claim 1 wherein the overhead data written to and read from individual blocks includes a count of a number of times that an addressed block has been erased.

6. The method of claim 1 wherein the overhead data written to and read from individual blocks includes an electrical parameter a previous erase cycle of an addressed block.

7. The method of claim 1 wherein the overhead data written to and read from individual blocks includes an error correction code calculated from the user data stored in memory cells within columns designated for storage of user data.

8. The method of claim 1 wherein the overhead data written to and read from individual blocks includes an error correction code calculated from the overhead data stored in memory cells within columns designated for storage of overhead data.

9. The method of claim 1 wherein the overhead data written to and read from individual blocks includes addresses of any defective cells within columns of respective individual blocks that are designated for storage of user data.

10. A method of formatting a flash EEPROM memory system having floating gate memory cells arranged in a two dimensional array of a plurality of columns and a plurality of rows thereacross, comprising:

grouping the rows of cells into unique blocks of cells which are individually addressable for simultaneous erasure of the cells within an addressed block, identifying any columns within the array that include a defect and storing a list of such defective columns, designating a plurality of contiguous cells in the individual rows of the array that do not include a defective column included on said list for receiving a chunk of a plurality of bits of overhead data, and storing column addresses of said designated chunks, whereby overhead data about the individual blocks and any user data stored therein may be recorded in the chunks.

11. A non-volatile flash EEPROM system, comprising:

an array of floating gate memory cells arranged in rows and columns, the rows being separated into individual blocks that are addressable for erasure together of the memory cells in the individual blocks, and the columns being grouped together into a plurality of unique chunks of memory cells within the individual rows that are each positioned in a plurality of contiguous columns, means for addressing the individual blocks by designating addresses of the chunks therein, means for maintaining a list of any defective columns within the array, means for maintaining an identification of at least one chunk of columns within the array that does not include a defective column noted on said list, and means for addressing said at least one chunk of columns within the individual blocks for storing overhead data relating to the blocks.

* * * * *